(12) United States Patent
Sumita

(10) Patent No.: US 6,574,711 B2
(45) Date of Patent: Jun. 3, 2003

(54) SEMICONDUCTOR INTEGRATED CIRCUIT

(75) Inventor: Masaya Sumita, Amagasaki (JP)

(73) Assignee: Matsushita Electric Industrial Co., Ltd. (JP)

( * ) Notice: Subject to any disclaimer, the term of this patent is extended or adjusted under 35 U.S.C. 154(b) by 336 days.

(21) Appl. No.: 09/742,239

(22) Filed: Dec. 22, 2000

(65) Prior Publication Data

US 2001/0007121 A1 Jul. 5, 2001

(30) Foreign Application Priority Data

Dec. 27, 1999 (JP) .......................................... 11-368558
Jan. 14, 2000 (JP) ...................................... 2000-005523

(51) Int. Cl.[7] ............................................. G06F 12/00
(52) U.S. Cl. ...................... 711/129; 711/123; 711/126; 711/128; 711/130; 305/49; 305/51; 305/52; 305/63
(58) Field of Search ................................ 711/118, 119, 711/120, 123, 125, 126, 128, 129, 130, 108; 365/49, 51, 52, 3

(56) References Cited

U.S. PATENT DOCUMENTS

| | | | | |
|---|---|---|---|---|
| 4,739,497 A | | 4/1988 | Itoh et al. ............... | 365/189.09 |
| 5,396,605 A | | 3/1995 | Sawamoto .................. | 711/207 |
| 5,457,648 A | * | 10/1995 | Eisig ............................ | 365/63 |
| 5,488,238 A | | 1/1996 | Enraku et al. ............... | 257/207 |
| 5,530,958 A | * | 6/1996 | Agarwal et al. ............... | 711/3 |
| 5,680,571 A | * | 10/1997 | Bauman ..................... | 711/122 |
| 5,749,087 A | * | 5/1998 | Hoover et al. ............... | 711/108 |
| 5,813,040 A | * | 9/1998 | Rathke ........................ | 711/156 |
| 5,905,996 A | * | 5/1999 | Pawlowski .................. | 711/119 |
| 6,014,732 A | * | 1/2000 | Naffziger .................... | 711/203 |
| 6,038,647 A | | 3/2000 | Shimizu ...................... | 711/168 |
| 6,067,600 A | | 5/2000 | Pawlowski .................. | 711/119 |
| 6,460,118 B1 | * | 10/2002 | Arimilli et al. ............. | 711/128 |

FOREIGN PATENT DOCUMENTS

| | | |
|---|---|---|
| EP | 0 374 842 | 6/1990 |
| EP | 0 706 132 | 4/1996 |

OTHER PUBLICATIONS

James Cho et al., "A 40K Cache Memory and Memory management Unit," Feb. 19, 1986, 1986 IEEE International Solid–State Circuits Conference Digest of Technical Papers, 33rd ISSCC, First Edition, pp. 50–52.

* cited by examiner

Primary Examiner—Do Hyun Yoo
Assistant Examiner—Brian R. Peugh
(74) Attorney, Agent, or Firm—Parkhurst & Wendel, L.L.P.

(57) ABSTRACT

It is an object of the present invention to provide a semiconductor integrated circuit having a chip layout that reduces line length to achieve faster processing. A cache comprises a TAG memory module and a cache data memory module. The cache data memory module is divided into first and second cache data memory modules which are disposed on both sides of the TAG memory module, and input/output circuits of a data TLB are opposed to the input/output circuit of the TAG memory module and the input/output circuits of the first and second cache data memory modules across a bus area to reduce the line length to achieve faster processing.

4 Claims, 14 Drawing Sheets

SEMICONDUCTOR INTEGRATED CIRCUIT

FIELD OF THE INVENTION

The present invention relates to a semiconductor integrated circuit and in particular to a one-chip large-scale integrated circuit having cache capability.

BACKGROUND OF THE INVENTION

A one-chip large-scale integrated circuit (LSI) containing a 32-bit microcomputer for controlling devices has been developed for built-in applications in the fields of digital and network appliances.

In the following description, the microprocessor part of the LSI will be called "microcomputer core."

In the field of network appliances, memory protection are becoming more important as the size of programs for implementing computer processing services are becoming larger and the programming environment are changing due to the installation of closed program modules or the installation by downloading program modules.

Therefore a microcomputer core includes a memory management unit (MMU) using a Translation Look-aside Buffer (TLB) as will be described below in order to support the implementation of memory protection capability. In the MMU implementation, the parallel execution of a cache access and a TLB search operation is accomplished in one machine-cycle by optimizing circuitry.

The basic operation of a cache will be described below.

FIG. 5 shows busses of the cache of a microcomputer core. While the cache is divided into an instruction cache 1 and a data cache 2 for processing an instruction access and a data access in parallel, the operations of these caches are the same. The operation of the data cache 2 will be described herein as an example.

The flow of an address signal for a memory access is as follows.

A central processing unit (CPU) core 3 accesses the data cache 2 through a bus interface (hereinafter called "BCIF") 4.

During a read operation, a virtual address output from the CPU core 3 is input into a data TLB 5 through the BCIF 4.

If a physical address corresponding to the virtual address is in the data TLB 5, the data TLB 5 outputs the physical address 6 and a hit signal as a hit/miss signal 7. Otherwise, it outputs a miss signal.

If the hit signal is output from the TLB 5, the physical address output from the TLB 5 is compared with tags (cache memory indices) in the data cache 2. If there is a match, the data corresponding to the physical address is output onto a data bus and the data and the hit signal is input into the CPU core 3 through the BCIF 4. The size of the output from the data cache 2 is 64 bits if it is data, or 32 bits if it is an instruction.

The steps of a write operation are the same until the output of a hit signal from the data cache 2. After that, instead of outputting data onto the bus, data which has been output from the CPU core 3 onto the bus precedently is written into the data cache 2.

The cache operation will be detailed below.

FIG. 6 shows a configuration of the data TLB 5 and the data cache 2.

A virtual address output from an address generator 8 in the CPU core 3 is input into the data TLB 5 through the BCIF 4.

The virtual address is compared with tags at TAG 5a. If there is a physical address corresponding to the virtual address, the high-order address of the physical address and a hit signal is output. Otherwise, a miss signal is output. If the physical address corresponds to protected memory, an exception signal is output and no data is output from the data cache 2.

On the other hand, because the low-order address of the virtual address is the same as that of the physical address, the low-order address is also input into the data cache 2 at the same time.

The data cache 2 has a TAG memory module 9 and cache data memory module 10. If there is an address corresponding to the low-order address in the TAG memory module 9 of the data cache 2, the high-order address of the physical address corresponding to the lower address is output.

If a hit signal is output from the data TLB 5, the high-order address of the physical address output from the data TLB 5 is compared with the TAG memory module 9 of the data cache 2 at 2a.

If there is a match, data corresponding to the address is output from the cache data memory module 10 onto the data bus and a hit signal is provided to the CPU core 3.

If no hit signal is output from the data TLB 5, or no hit signal is output from the data cache 2, a miss signal is output to the CPU core 3.

If an exception signal is output from the data TLB 5, no data is output from the data cache 2, instead, exception management is performed by the CPU core 3.

The steps for a write operation are the same as the steps described above until the output of the hit signal from the data cache 2. After the hit signal is output, instead of outputting data onto the bus, data which has been output from the CPU core 3 onto the bus precedently is written into the data cache 2. If an exception signal is output from the data TLB 5, data is not written into the data cache 2. Instead, exception management is performed by the CPU core 3.

In this way, part of the virtual address-physical address translation at the data TLB 5 and part of the match finding in the cache control are performed concurrently in order to increase the speed of cache operations.

Thus the cache operations can be performed within one cycle. Access latency can be reduced by eliminating the accesses to main memory using the cache memory especially when an arithmetic operation which requires memory read/write operations is performed in a number of cycles.

FIG. 7 shows access timing during cache read operation. If a miss signal is output, operation in the cycle halts at that point. FIG. 8 shows access timing during a cache write operation (when exception management is OK). FIG. 9 shows access timing during a cache write operation (when exception management is NG).

The operation time is the sum of time required for "TLB TAG comparison", "TLB data read", "cache TAG comparison", "cache hit signal output", and "cache data output."

In order to achieve faster operation (reduce the amount of time by one machine cycle, or one cycle clock), the amount of time required for each of these steps should be reduced.

DISCLOSURE OF THE INVENTION

FIG. 10 shows a chip layout of a prior art.

While only a data cache will be illustrated and described below as an example, the same applied to an instruction cache as mentioned earlier.

A TLB bus input 11 connects a TLB TAG module 12 comprising a TLB TAG 12a and its I/O 12b in a data TLB 5 with the BCIF 4 mentioned earlier. The TLB TAG 12 is memory containing address translation data.

The TLB data memory module 14 of the data TLB 5 comprises a TLB buffer 14a and its I/O 14b. The TAG memory module 9 of the data cache 2 comprises a cache TAG 9a and its I/O 9b. The cache TAG 9a is memory containing cache indices.

The I/O 14b of the TLB module 14 and the I/O 9b of the TAG memory module 9 is connected by a TLB bus output line 13.

A cache data memory module 10, which is memory containing cache data, comprises cache data memory 10a and an I/O 10b. A hit signal of the TAG memory module 9 is input in the I/O 10b of the cache data memory module 10 from the I/O 9b of the TAG memory module 9.

A cache bus 15 connects to a CPU core 3 through the BCIF 4 and connects to an external bus 17 through a bus control unit (BCU) 16 shown in FIG. 5.

In the prior-art chip layout, the modules 12, 14 of the data TLB 5 and the modules 9, 10 of the data cache 2 are designed as separated modules and the wiring between the modules is provided subsequently, entailing a long line length.

Generally, a wiring delay is expressed by $0.4 * R * C$ (where, R is wire resistance and C is wire capacitance) and a longer line length will provide larger R and C.

The propagation delay time between the TLB and the cache TAG, or the propagation delay time through the "data read" line length to the cache TAG to the cache data memory module, that is, the "cache hit signal output" line length, prevents faster operation.

In particular, assuming that the width of the TLB data memory module 14 is L, the width of the TAG memory module 9 is 2L, the width of the cache data memory module 10 is 4L, and the width of the bus area 18 is A, the line length of the TLB bus output 13, that is, the maximum length of the TLB bus data read line will substantially be:

T1=A+L+A+A+L+2L+A=4A+4L.

The object of the present invention is to provide a semiconductor integrated circuit with a chip layout that allows faster processing by reducing the line length compared with prior-art chip layouts.

Because virtual addresses are used as the addresses of recent central processing units, address translation is required between a virtual address and the real address of cache memory or main memory. Therefore a translation table becomes larger as address space expands. Typically, the table is organized hierarchically. Because it takes much time to retrieve a real table by referencing the hierarchically organized table, a table called a TLB (hereinafter called "TLB") which has an association capability is provided parallel with the hierarchical table to retrieve the real address faster. Thus the TLB should allow address translation to be performed at high speed as well as with high accuracy by means of small-sized circuitry.

Even though line width, line spacing, line length and line thickness have decreased as semiconductor integrated circuits have become miniaturized, data cannot be output faster because, assuming that the same line material is used and the scaling factor is "S", the wire resistance R will increase by a factor of S and the wire capacitance will decrease by a factor of S, resulting in the same delay product of $R*C$.

There is another problem. Letting the capacitance of the layer under the wiring be Cb, the capacitance between lines be Cs, and the wire resistance be R, the wiring delay of the output of the data memory module is expressed by R (Cb+2×Cs). However, when the main output and an adjacent signal output change in opposite directions, the adjacent capacitance Cs seems to be two times larger. Therefore the maximum delay will be R (Cb+2×2×Cs), which is slower than normal states. Furthermore, if delay time is reduced by providing a larger driver to increase the instantaneous current of a transistor, a supply voltage drop may occur when all data busses undergo changes. The voltage drop increases the delay. In addition, if signals on lines in layers below and above a data bus make a transition while the bus is in hold state, its output value may be inverted, which cannot be controlled by the resistance in the hold state of the bus.

It is an object of the present invention to provide a semiconductor integrated circuit that allows substrate noise and noise from other signal lines which affect a data bus to be reduced and faster data output operation to be achieved.

SUMMARY OF THE INVENTION

A semiconductor integrated circuit according to claim 1 of the present invention includes a cache capability provided by a Translation Look-aside Buffer (TLB) and a cache, wherein the cache comprises a TAG memory module and a cache data memory module, the cache data memory module is divided into first and second cache data memory modules which are disposed on both sides of the TAG memory module; and input/output circuits of the TLB are opposed to an input/output circuit of the TAG memory module and input/output circuits of the first and second cache data memory modules across a bus area.

A semiconductor integrated circuit set forth in claim 2 of the present invention is the one according to claim 1, wherein each of the TAG memory module and the first and second cache data memory modules is further divided into two and the divided modules are disposed on both sides of the TLB.

A semiconductor integrated circuit set forth in claim 3 of the present invention includes a cache capability provided by a translation look-aside buffer (TLB) and a cache, wherein the TLB comprises a TLB tag module storing address change data and a TLB data memory module storing Translation Look-aside data; the cache comprises a TAG memory module storing cache memory index data and a cache data memory module storing cache data; the TAG memory module is divided into a plurality of modules and the cache data memory module is divided into a plurality of modules; the divided TAG memory modules are disposed on both sides of a longitudinal arrangement direction of the TLB tag module and the TLB data memory module with the TLB tag module and TLB data memory module being sandwiched therebetween; and the divided cache data memory modules are grouped into two and disposed on both sides of said divided TAG memory modules.

A semiconductor integrated circuit set forth in claim 4 of the present invention is the one according to claim 3, wherein the input/output circuits of one of the two groups of caches disposed on both sides of the longitudinal arrangement direction of the TLB tag modules and the TLB data memory modules with said TLB tag modules (12-1, 12-2) and TLB data memory modules (14) being sandwiched therebetween are opposed to the input/output circuits of the TLB.

A semiconductor integrated circuit as set forth in claim 5 of the present invention includes cache memory comprising a plurality of data memory modules, wherein first and second power supply lines are provided in a layer under output signal lines connected to the output of the data memory module section, and the first and second power supply lines intersect said output signal lines at a right angle and are alternately and repeatedly provided.

A semiconductor integrated circuit set forth in claim 6 of the present invention is the one according to claim 5, wherein the first and second power supply lines are provided in a layer above the output signal lines, and the first and second power supply lines intersect said output signal line at a right angle and are alternately and repeatedly provided.

A semiconductor integrated circuit set forth in claim 7 of the present invention is the one according to claim 5 or 6, wherein a power-supply potential is provided to the first power supply line, a ground potential is provided to the second power supply line, a P-channel MOS transistor is provided in a layer under the first power supply line, a gate of the P-channel MOS transistor is connected to the second power supply line, a drain and a source of the P-channel MOS transistor are connected to the first power supply line, an N-channel MOS transistor is provided in a layer under said second power supply line, a gate of the N-channel MOS transistor is connected to the first power supply line, and a drain and a source of the N-channel MOS transistor are connected to the second power supply line.

A semiconductor integrated circuit set forth in claim 8 of the present invention is the one according to any of claims 5 to 7, wherein no other signal line in a layer above or below or adjacent to the output signal lines is provided in parallel to all or any part of the output signal lines.

A semiconductor integrated circuit set forth in claim 9 is the one according claim 8, wherein the first or second power supply line is provided in parallel to all or part of the output signal line between the output signal line and another signal line.

A semiconductor integrated circuit set forth in claim 10 is the one according to any of claims 5 to 9 comprising a plurality of outputs as the output of the data memory module, wherein the outputs comprise pairs of non-inverse and inverse signals, and each set of signal lines connected to each pair of the pairs of non-inverse and inverse outputs are provided between the first and second power supply lines.

A semiconductor integrated circuit set forth in claim 11 is the one according to any of claims 5 to 10, wherein the output from the data module is output to the output signal lines through a first sense amplifier.

A semiconductor integrated circuit set forth in claim 12 is the one according to claim 11, wherein a given signal is selected from the plurality of data module outputs and output through a second sense amplifier.

DESCRIPTION OF THE EMBODIMENTS

Embodiments of the present invention will be described below with reference to FIGS. 1 to 4 and FIGS. 11 to 15.

Figure 1:
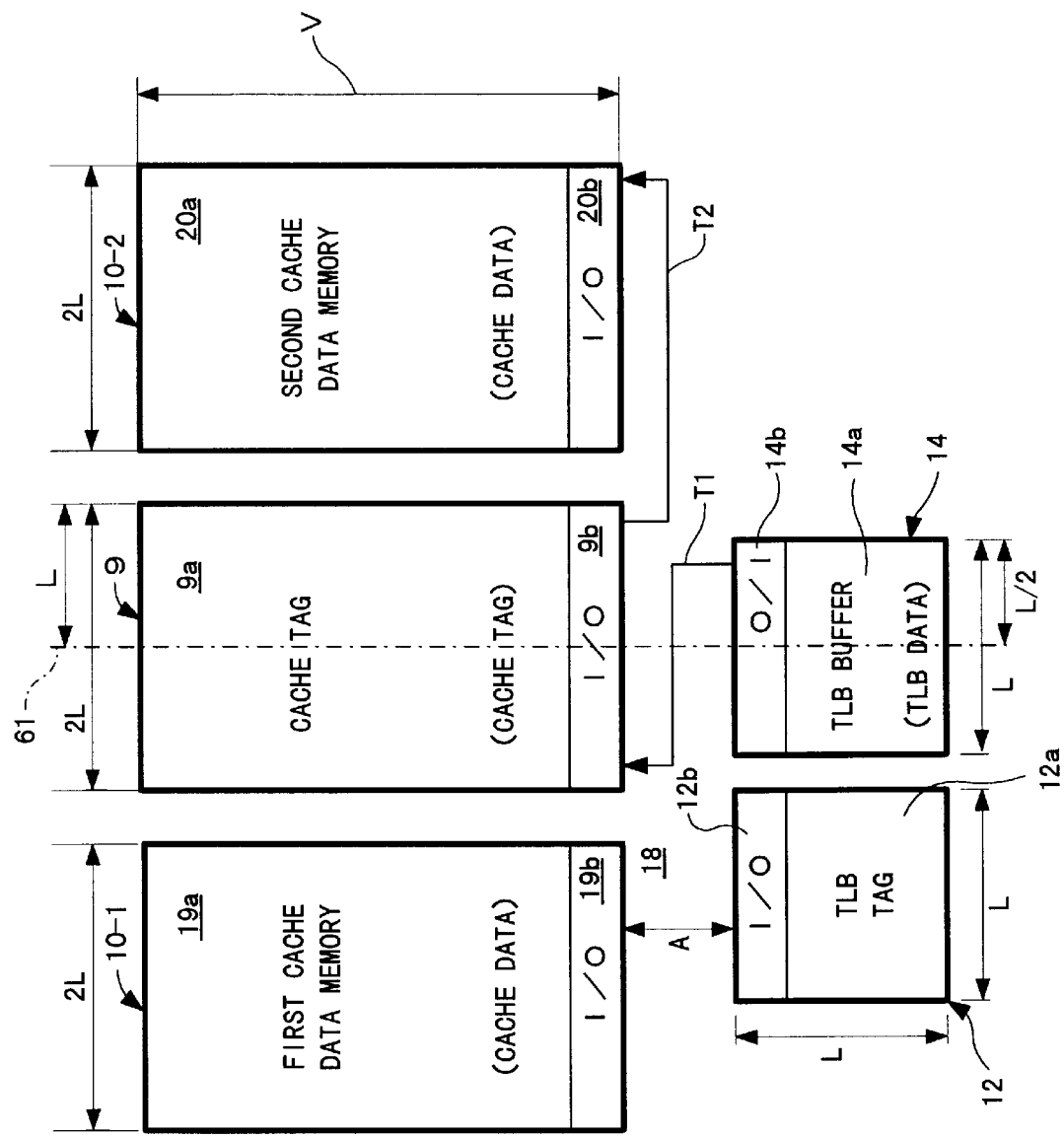
FIG. 1 shows a chip layout of a cache in a one-chip LSI according to a first embodiment of the present invention.
Figure 2:
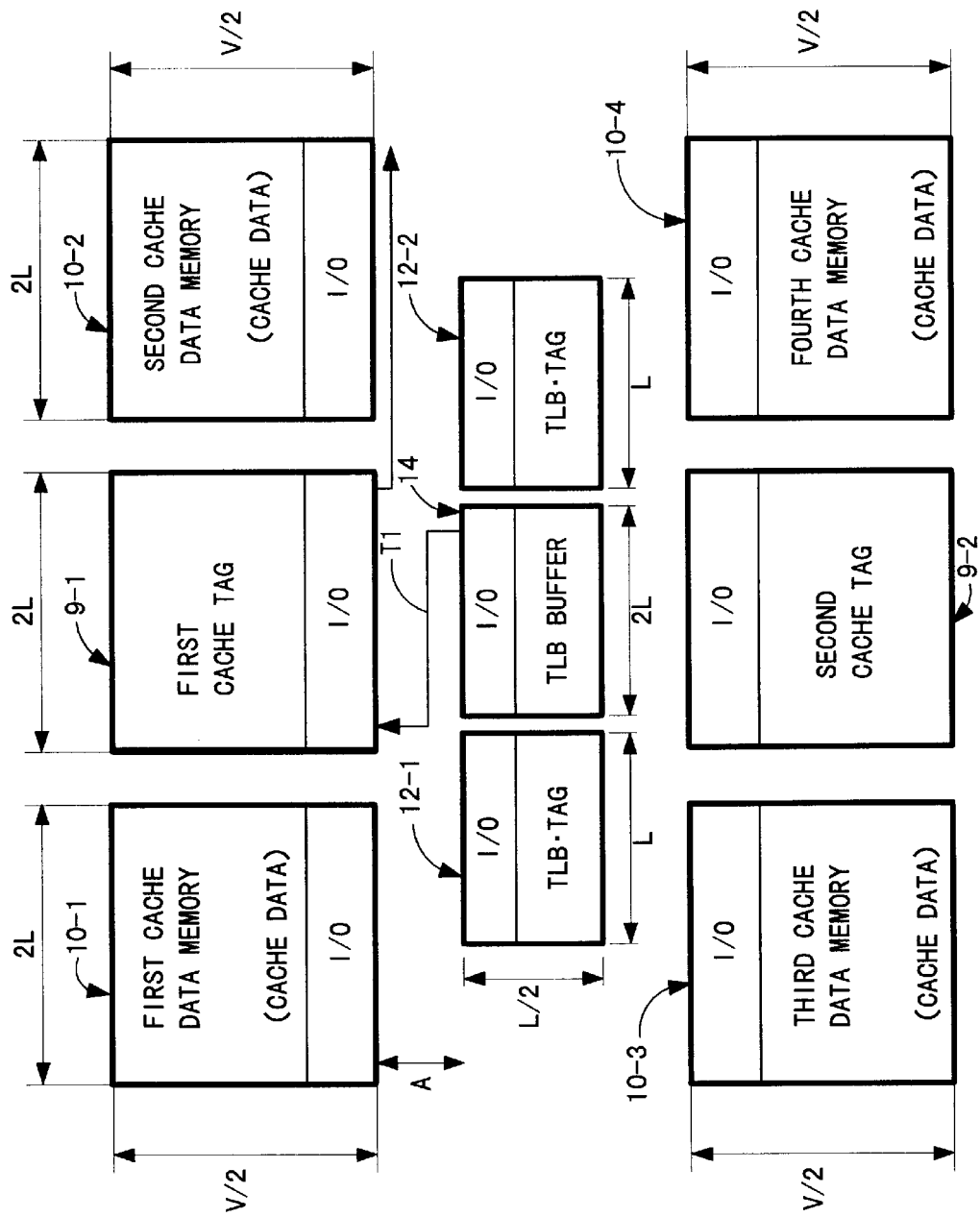
FIG. 2 shows a chip layout of a cache in a one-chip LSI according to a second embodiment of the present invention.
Figure 3:
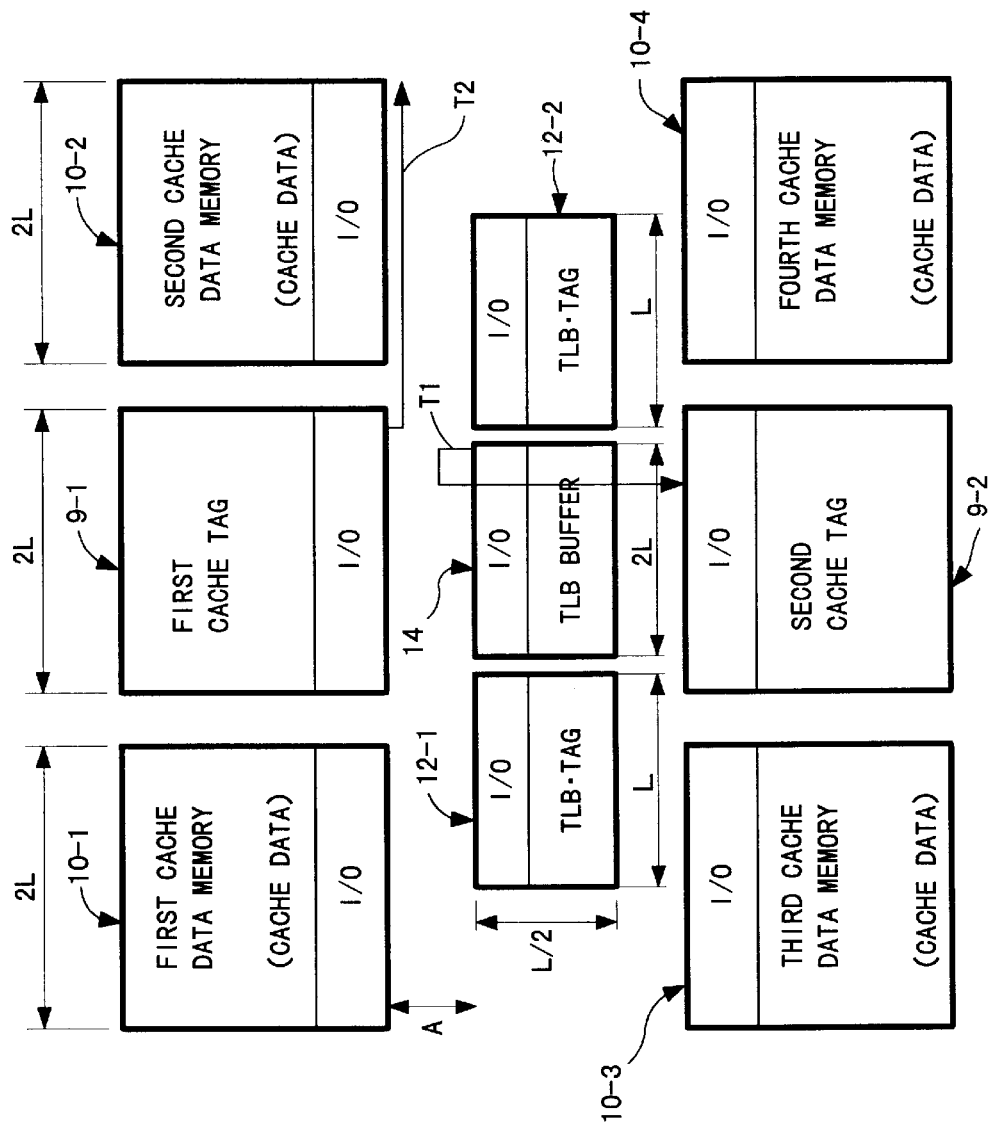
FIG. 3 shows a chip layout of the cache according to the second embodiment.

In FIGS. 1 to 3 showing a layout of modules of the embodiments, the actual distance between blocks is negligible in calculating line lengths.

First Embodiment

Figure 5:
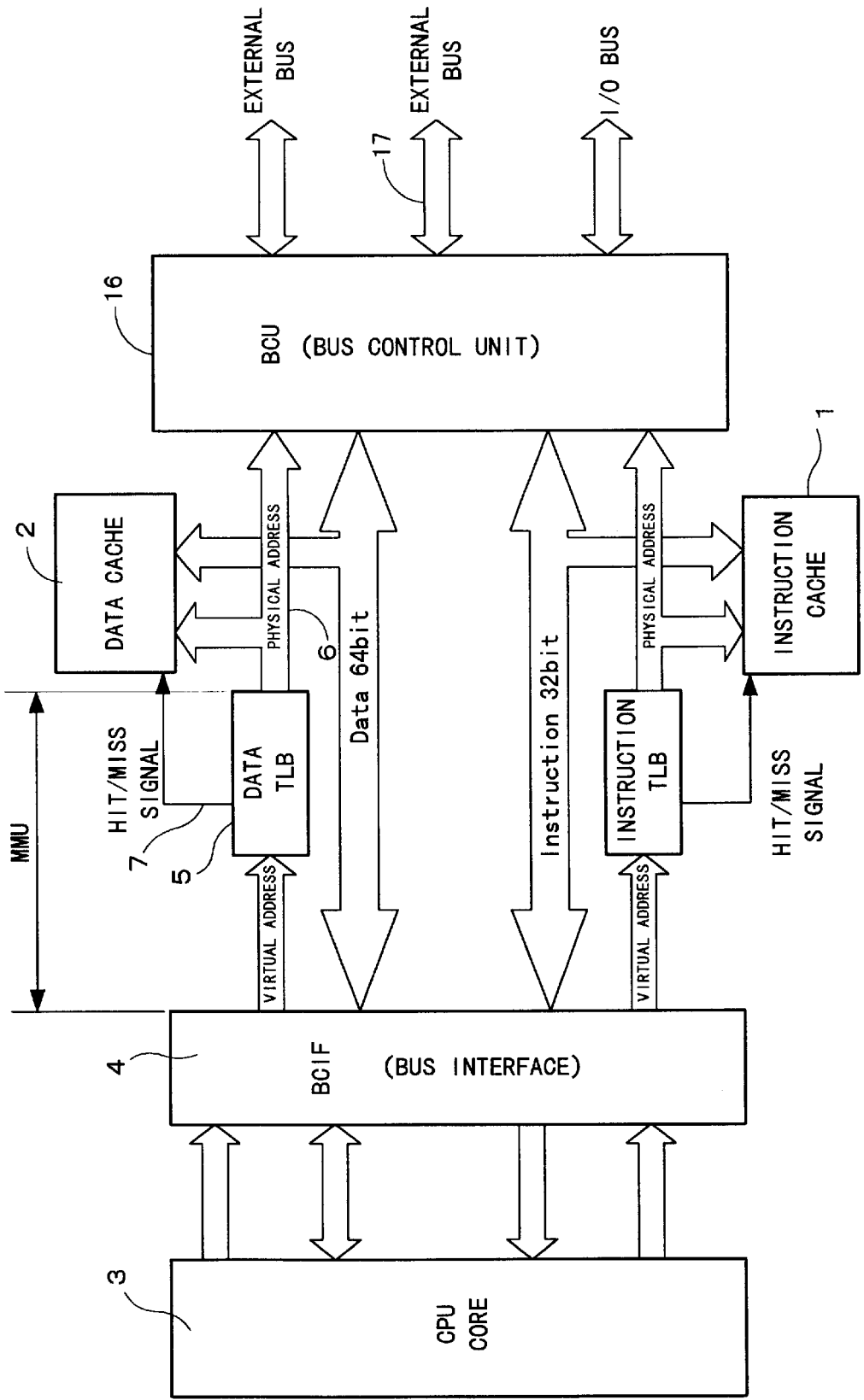
FIG. 5 shows a block diagram of busses associated with a cache in a one-chip LSI according to a prior art.
Figure 6:
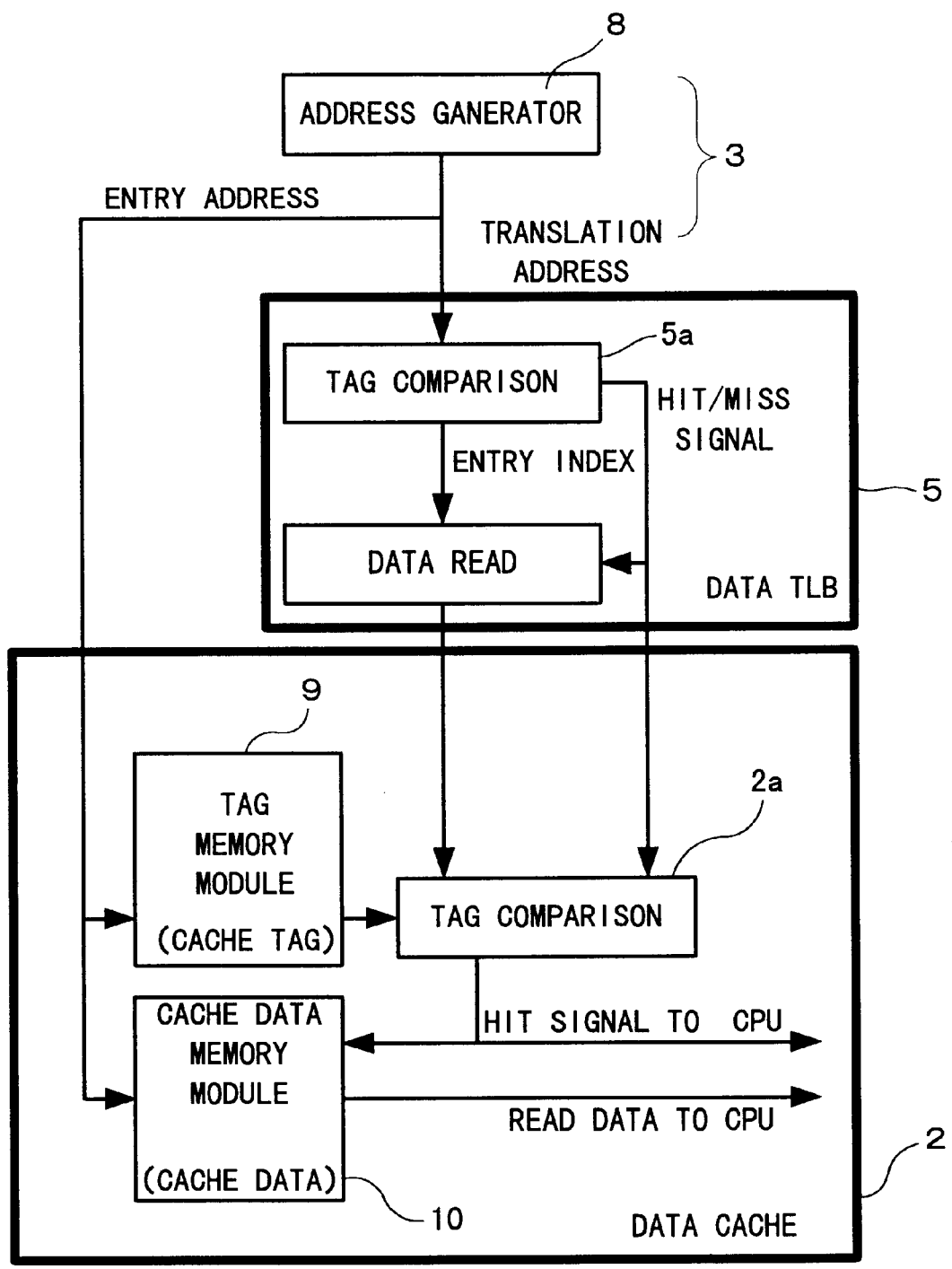
FIG. 6 shows a block diagram of the cache according to the prior art.
Figure 7:
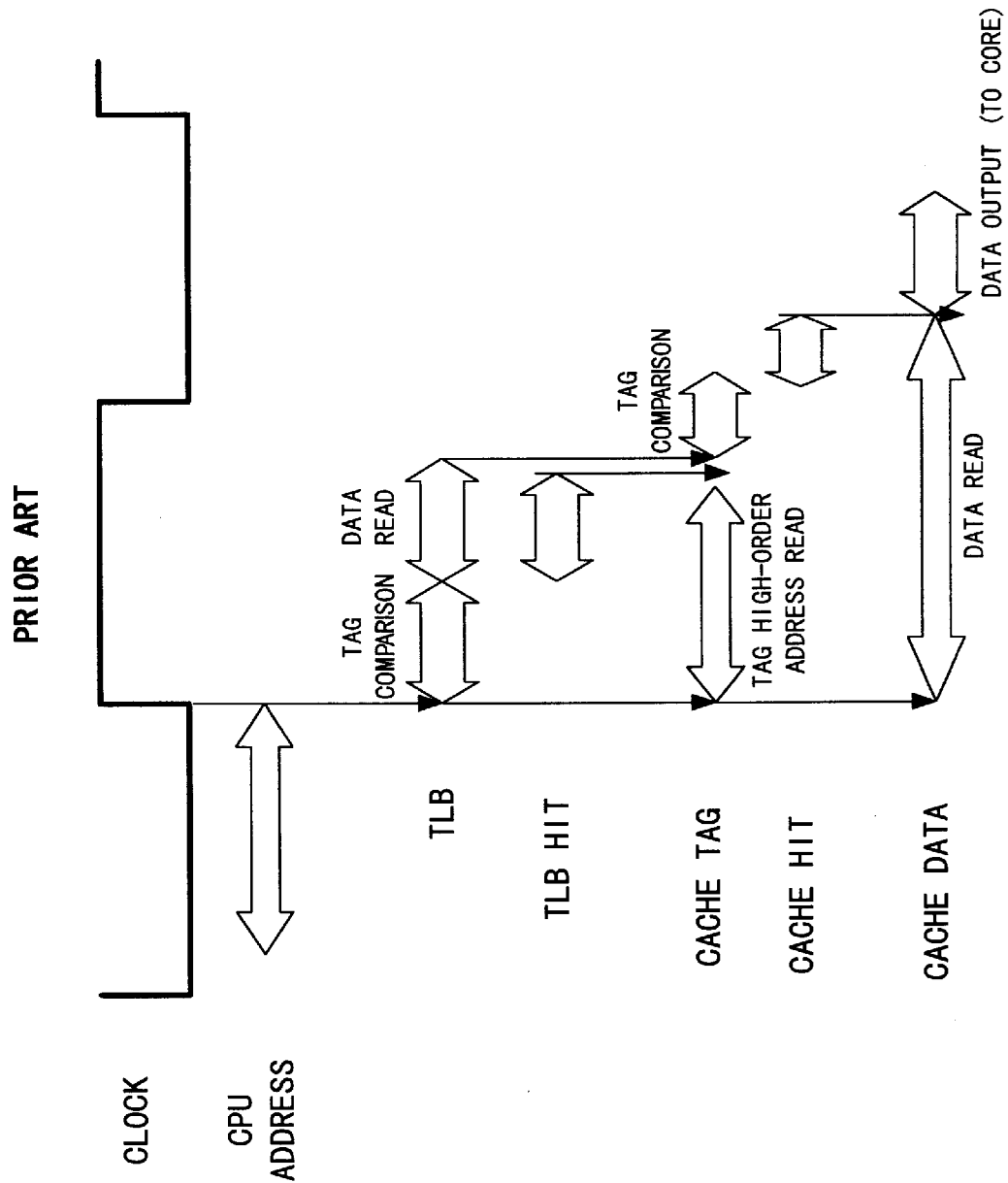
FIG. 7 shows an access timing diagram of the read system of the cache according to the prior art.
Figure 8:
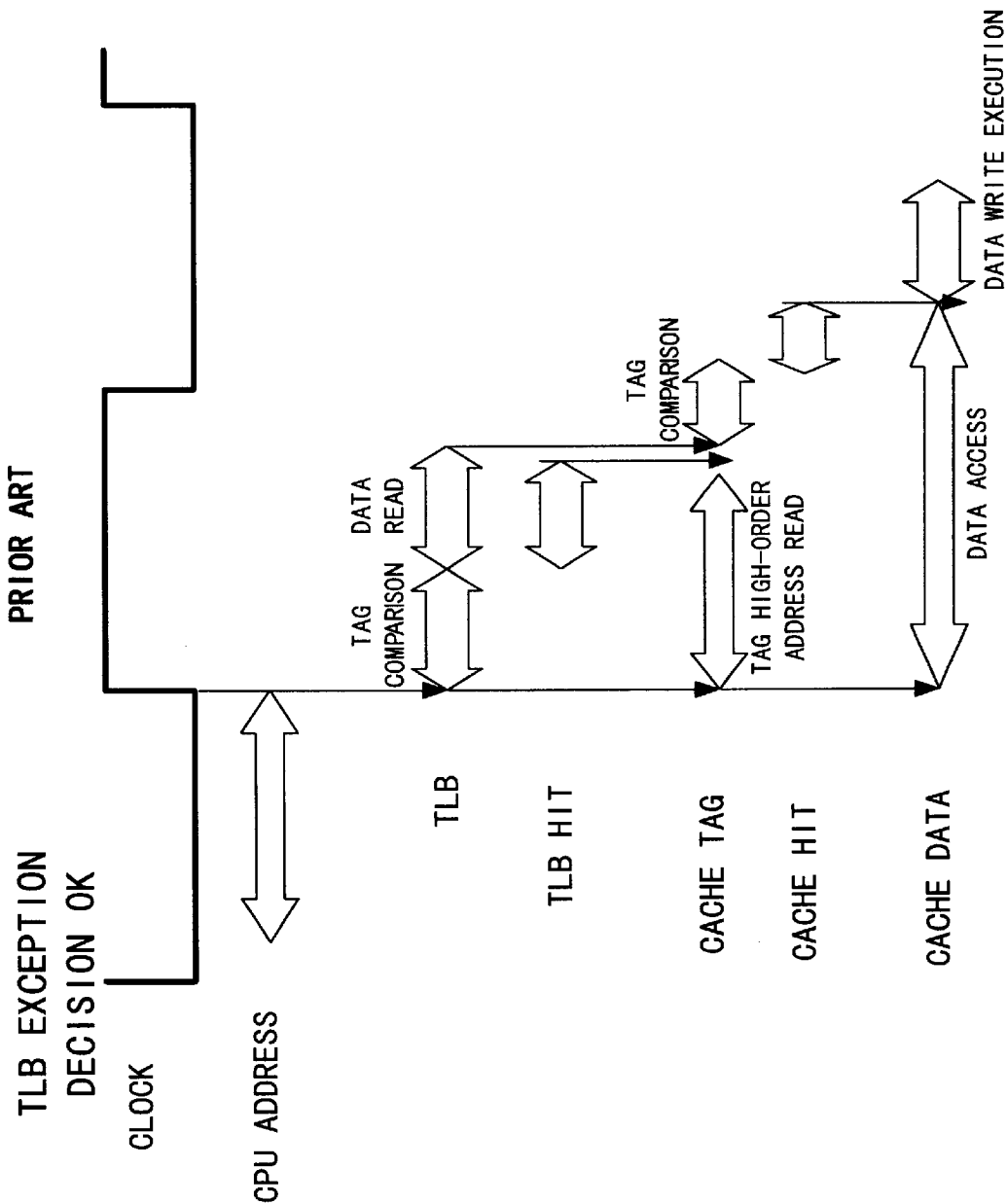
FIG. 8 shows an access timing diagram of the write system of the cache according to the prior art when exception decision is OK.
Figure 9:
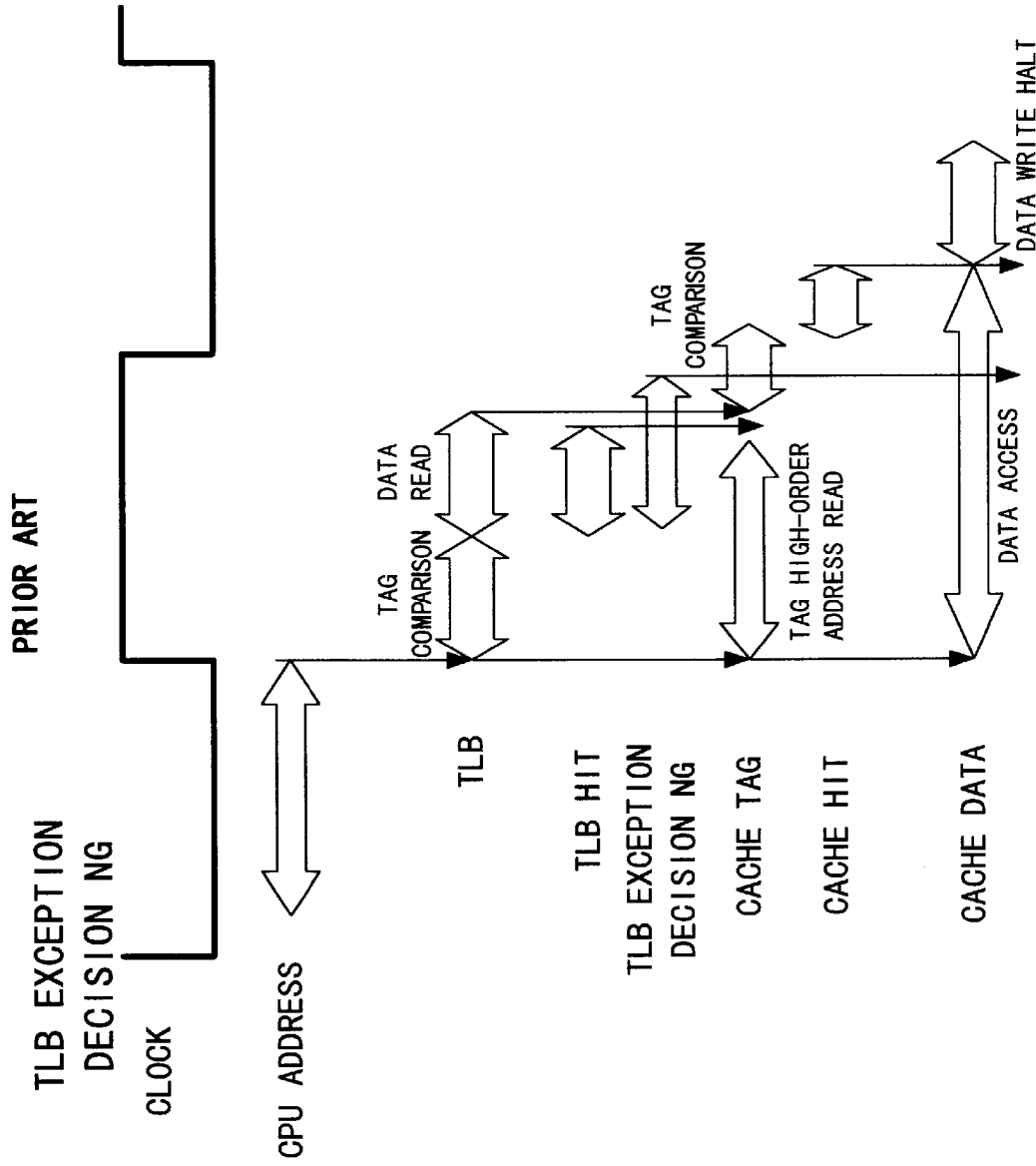
FIG. 9 shows an access timing diagram of the write system of the cache according to the prior art when exception decision is NG.

FIG. 1 shows a first embodiment in which line length is reduced by making changes to a prior-art chip layout shown in FIG. 10 as will be described below. The chip layout of this embodiment will be described herein with respect to a data cache 2 shown in FIG. 5 as an example.

In the chip layout shown in FIG. 1, a data cache 2 comprises a TAG memory module 9 and a cache data memory module 10 and the cache data memory module 10 is divided into first and second cache data memory modules 10-1, 10-2, which are disposed on both sides of the TAG memory module 9.

The first cache data memory module 10-1 comprises first cache data memory 19a and an I/O circuit 19b. The second cache data memory module 10-2 comprises second cache data memory 20a and an I/O circuit 20b.

Input/output circuits 12b, 14b of a data TLB 5 are opposed to the I/O circuit 9b of the TAG memory module and the I/O circuits 19b, 20b of the first and second cache data memory 10-1, 10-2 across a bus area 18.

Figure 10:
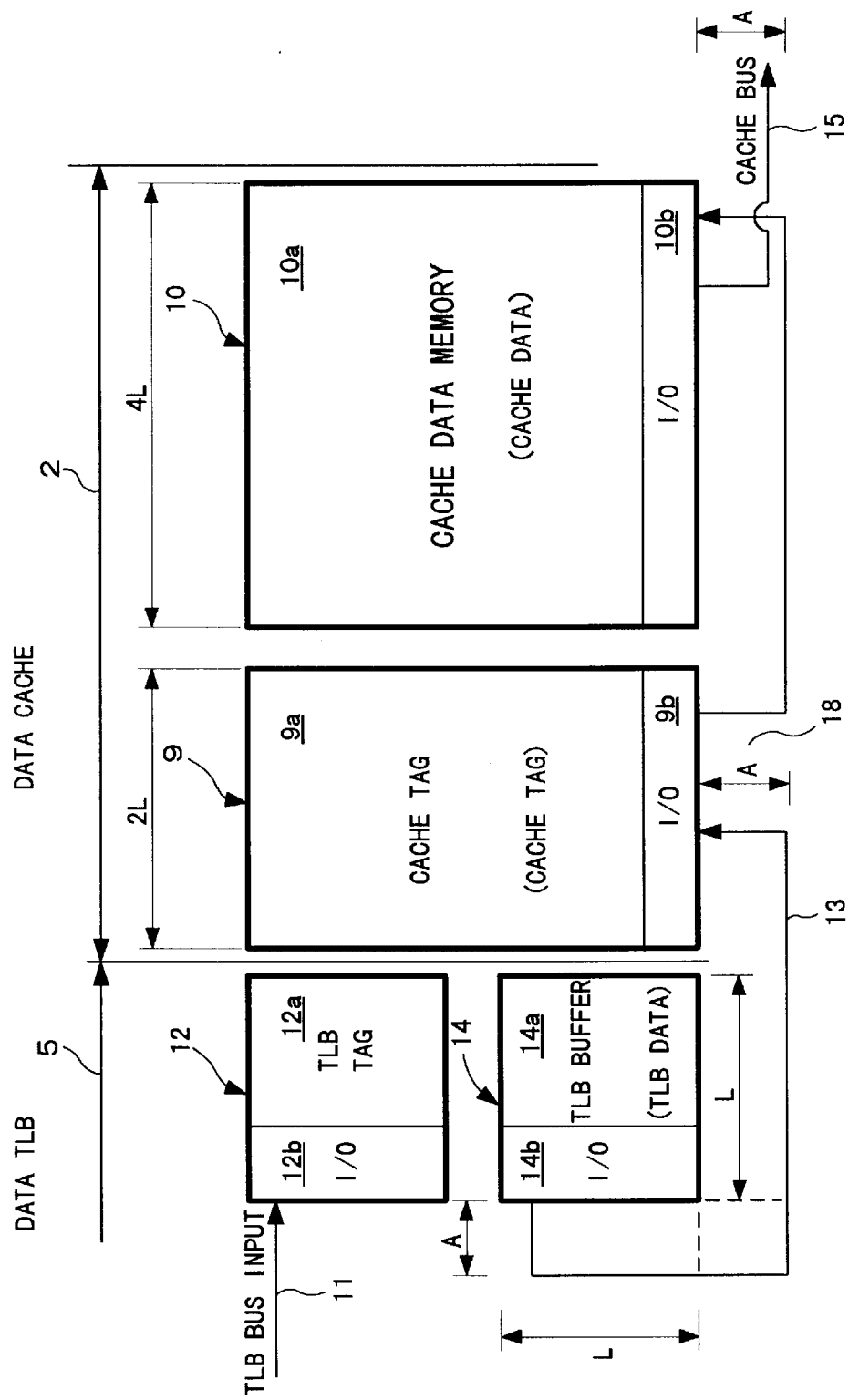
FIG. 10 shows a chip layout of the cache in the one-chip LSI according to the prior art.

The width of each of the first and second cache data memory modules 10-1, 10-2 is 2L, which is provided by dividing the cache data memory having a width of 4L shown in FIG. 10 into two. The width of the bus area 18 is A and one side of the TAG memory module 9 is 2L, as in FIG. 10.

The center of the width of the TLB data memory module 14 is aligned with the center of the width of the TAG memory module 9 as indicated by the center line 61, therefore the maximum value of the length T1 of the TLB bus output wiring for reading TLB bus data in this chip layout will be approximately the sum of the length "(½)L" from the right most end to the center of the TLB buffer 14a, the length "L" from the center to the left most end of the first cache data memory 19a and the bus width "A", (3/2) L+A. The value is less than T1 (the maximum value)=4L+4A in the prior-art layout shown in FIG. 10.

Line length T2 of cache hit signal output will be considered below.

A cache hit signal is output from the both ends of the I/O circuit 9b of the TAG memory module 9. T2 (the maximum value) is 4L in the prior-art layout shown in FIG. 10, whereas T4 (the maximum value) is approximately 2L in the first embodiment shown in FIG. 1, which is a half of the value in the prior-art layout.

While the chip layout of the data cache 2 has been described as an example out of the two caches, the instruction cache 1 and the data cache 2 for processing an instruction access and a data access in parallel, the above description similarly applies to the chip layout of the instruction cache 1.

Second Embodiment

Signal propagation time may become problematically large if the height "v", of the first and second cache data memory 19a, 20a in the first embodiment is increased as the storage capacity of the data cache 2 increases. In a second embodiment shown in FIGS. 2 and 3, each of the first and second cache data memory modules 10-1, 10-2 in the first embodiment shown in FIG. 1 is further divided into two to provide a first, second, third, and fourth cache data memory modules 10-1, 10-2, 10-3, and 10-4 having a width of 2L and a height of v/2. The first and second cache data memory modules 10-1, 10-2 are positioned on one side of a data TLB 5 and the third and fourth cache data memory modules 10-3, 10-4 are positioned on the other side of the data TLB 5. In addition, the data TLB 5 comprises a TLB TAG module 12 and a TLB data module 14. The TLB data memory module 12 is formed so as to have a width of 2L and a height of L/2. The TLB TAG module 12 is divided into first and second TLB TAG modules 12-1 and 12-2 having a width of 2L and a height of L/2 and the first and second TLB TAG modules 12-1, 12-2 are positioned on both sides of the TLB data memory module 14.

The line length T1 (the maximum length) of the TLB data read line to the first cache TAG 9-1 is approximately the sum of the length "L" from the right most end to the center of the TLB data module 14, the length "L" from the center to left most end of the first cache TAG 9-1, and the bus width "A": T1=2L+A in FIG. 2. In FIG. 3, TLB data read line length T1 (the maximum length) to the second cache TAG 92 is approximately T1=(5/2)L+2A. The line length T2 (the maximum length) of the cache hit signal output is 2L, which is the same as that of the first embodiment shown in FIG. 1.

The line length T1 of the TLB data read line to the second cache TAG 9-2 is equal to (5/2)L+2A, which is longer than that of the first embodiment shown in FIG. 1. However, if cache data read time affected by the height of the cache data memory is dominant, the layout shown in FIG. 3 will be chosen.

Third Embodiment

Figure 4:
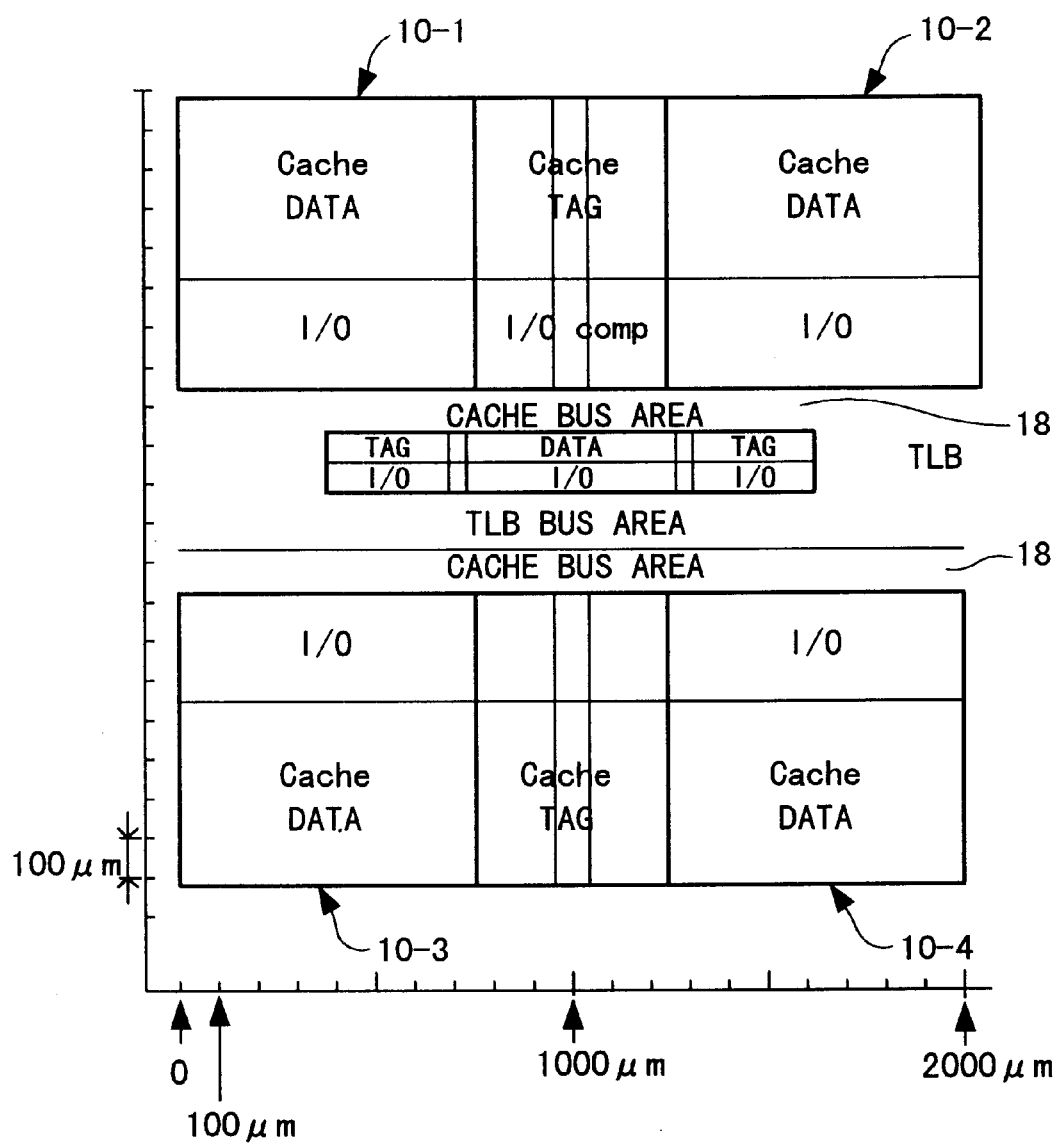
FIG. 4 shows a chip layout of a cache in a one-chip LSI according to a third embodiment of the present invention.

FIG. 4 shows a specific example of a chip layout in which the address length is 32 bits, data length is 128 bits, the number of entries in a TLB is 32, and the number of entries 128 in a cache is 128. The number of entries herein represents the number of registered data items that is compared with input data.

The width of first and second TLB TAG modules 12-1, 12-2 is approximately 300 μm, the width of a TLB buffer 14 is approximately 200 μm, and the height of the both is 300 μm in a prior-art layout, whereas the width of each of the first and second TLB TAG modules 12-1, 12-2 is approximately 300 μm, the width of the TLB buffer 14 is approximately 500 μm, ant the height of the both is approximately 150 μm in the layout of the third embodiment.

The width of each of first and second cache TAGs 9-1, 9-2 is approximately 400 μm, the height of them is about 700 μm. The width of prior-art cache data memory is approximately 1600 μm. Cache data memory of the present invention is horizontally divided into two, therefore each of first, second, third, and fourth cache data memory modules 10-1 to 10-4 has a width of approximately 800 μm and a height of approximately 700 μm. The width of a bus area is approximately 100 μm.

It is assumed that the height and width of a TLB TAG and TLB DATA block are L, the width of a cache TAG memory module is 2L, the width of a cache DATA memory module is 4L, and the width of a bus area is A (for 32 lines in this embodiment).

Fourth Embodiment

Because virtual addresses are used in a recent central processing unit, address translation is required between a virtual address used in the CPU and a real address used in cache memory and main memory. Therefore, the size of a translation table is increased as address space increases. Typically, the translation table is organized hierarchically. Because it takes much time to retrieve a real address by referencing the hierarchical table, a table called "TLB" that has an association capability is provided in parallel with the hierarchical table to retrieve a real address at high speed. Not only should the TLB perform address translation at high speed, they also should perform the address translation with high accuracy by using a small-sized circuit.

Two association systems, called full associative and set associative systems, are used for the TLB. The former requires that an input address be compared with all data stored in the TLB to find a match, and if there is a match, a signal indicating the match and the matching data are output. In the latter set associative system, candidates addresses which may expected to be a match are selected and compared with the input address. If there is matching data, a signal indicating the match and a real address corresponding to the matching address are output. A set associative system which groups the candidates into n groups is called the n-way set associative system.

Figure 11:
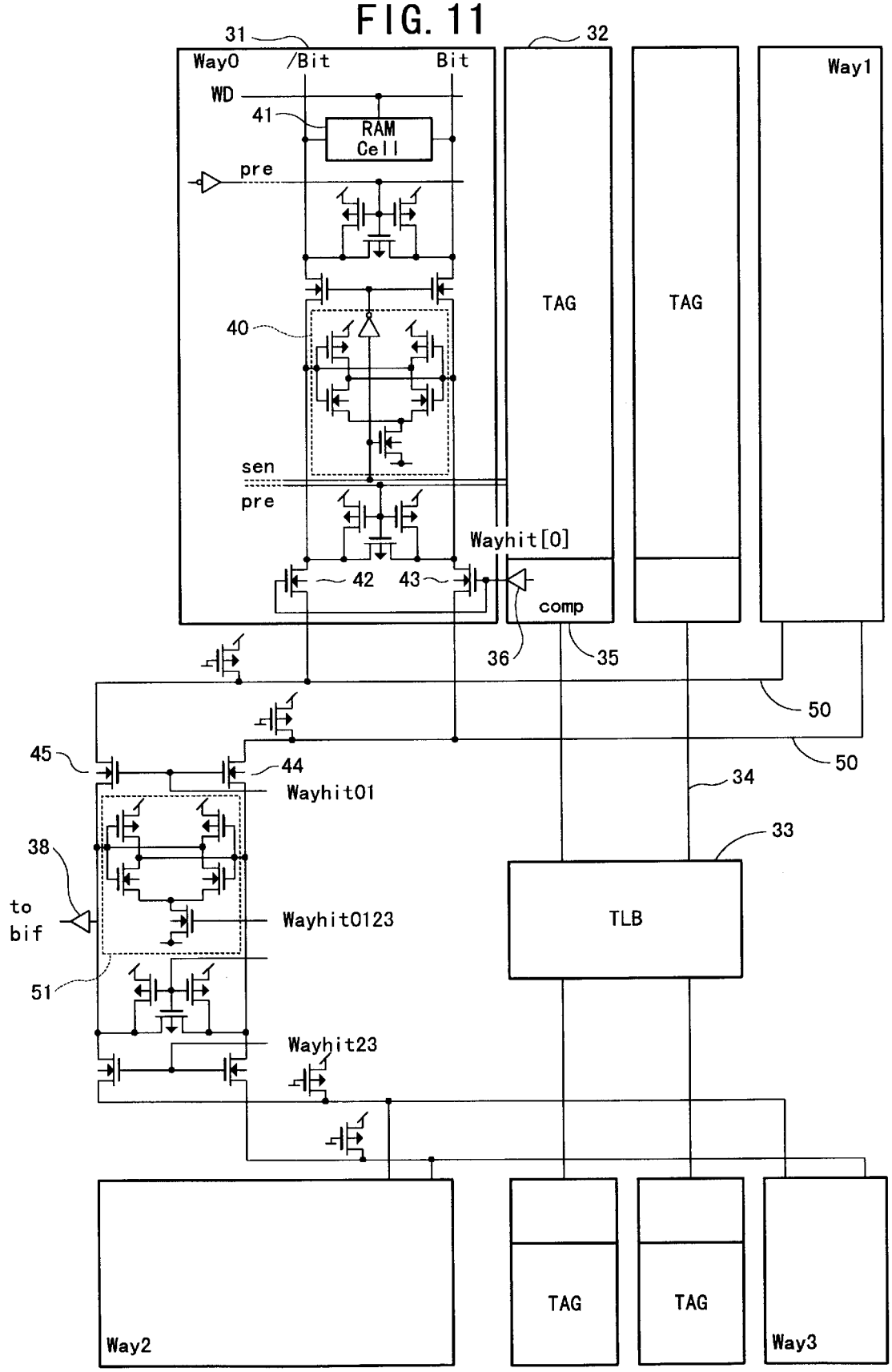
FIG. 11 shows a block diagram of a semiconductor integrated circuit according to a fourth embodiment of the present invention.

FIG. 11 shows one example of a semiconductor integrated circuit according to the present invention. A physical layout of a 4-way set associative cache and a TLB is shown in FIG. 11.

Reference number 31 indicates a data memory module of cache memory and reference number 32 indicates a tag section of the cache memory. Four sets of a data memory module and a tag section, one set for each way, are provided. Reference number 33 indicates the TLB.

The TLB 33 is positioned in the middle and inputs/outputs for signals of the data memory module 31 and the tag section 32 of the cache memory are positioned so as to be adjacent to or opposed to each other. A data bus 50 is provided between the circuits of the ways and isolated from external signals so that the data bus wiring length is reduced.

A physical address translated at the TLB 33 is input to a comparator 35 in the tag section of each way over an address line 34. The comparator 35 of each way compares the physical address with data in each TLB and, if there is matching data, outputs a hit signal. For example, if there is a match in way0, a hit signal is output through a buffer 36. A signal of a matched memory cell 41 in the data memory module 31 of the cache is amplified by a sense amplifier 40. Signals Bit and /Bit of the memory cell 41 are a pair of non-inverse and inverse signals and provided onto the data bus 50 through N-channel MOS transistors 42, 43 which are brought into conduction by a hit signal output from the buffer 36, and provided through N-channel MOS transistors 44, 45 which are brought into conduction by an OR signal, wayhit01, of a hit signal from way0 or way1, then amplified by a sense amplifier 51 activated by anOR signal, wayhit0123, of way0, way1, way2, or way3, and finally output to the outside of the cache through a buffer 38.

Figure 15:
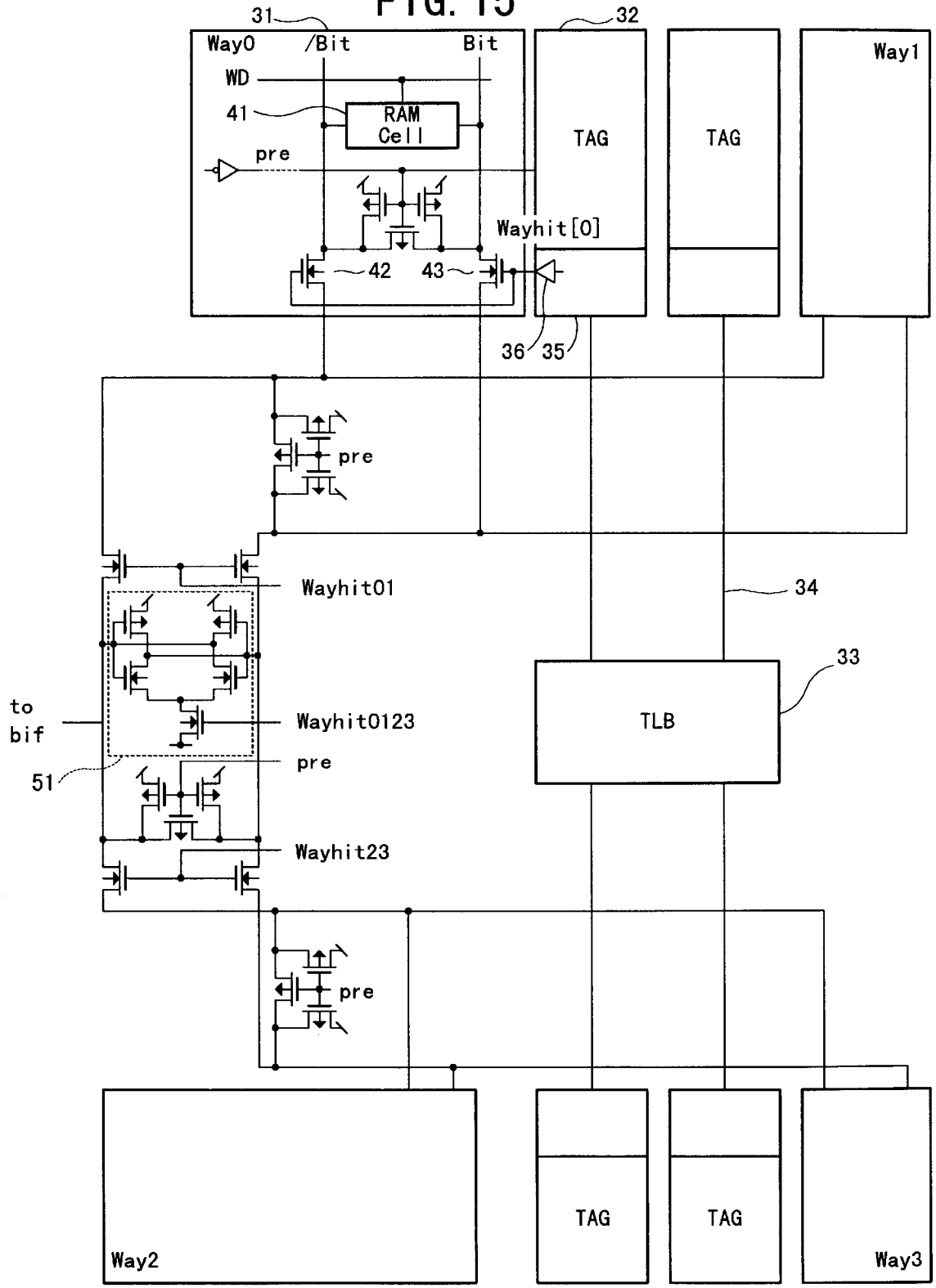
FIG. 15 shows a block diagram of a semiconductor integrated circuit according to another embodiment of the present invention.

As shown in FIG. 15, the signal may be output through a sense amplifier instead of the buffer 38. The sense amplifiers of the data memory module 31 may be reduced and only the sense amplifier 51 may be used. A non-inverse signal output from the sense amplifier 51 may be input into the set input of an RS flip-flop and an inverse signal output from the sense amplifier 51 may be input into the reset input of the RS flip-flop to prevent incorrect data due to a malfunction of the sense amplifier to be output to the outside.

Figure 12:
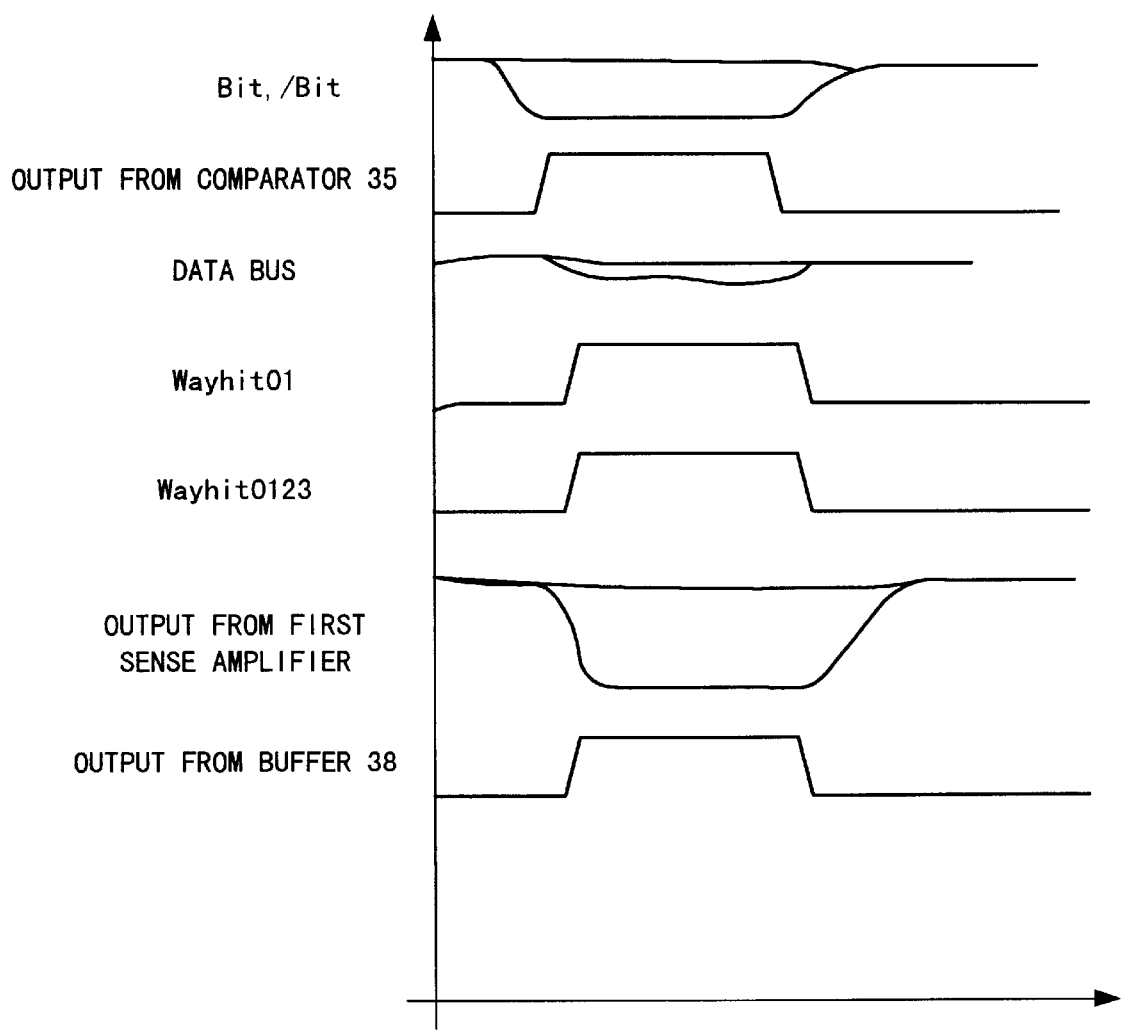
FIG. 12 shows a timing chart of the semiconductor integrated circuit according to the fourth embodiment of the present invention.

FIG. 12 shows a timing chart when an comparison result signal of the comparator 35 is activated after data in the tag section 32 that matches the physical address output from the TLB 33 is found. The horizontal axis indicates transient time and the vertical axis indicates voltage representing transitions on each signal line. If the physical address matches data in a way, signal Bit and reverse signal /Bit output from way0 change. When the hit signal of the comparator 35 goes high, the N-channel MOS transistors 42, 43 connected to the output of the comparator 35 is brought into conduction and the output signal of the sense amplifier 40 is provided onto the data bus 50. Because the data bus is pulled up to VDD, it remains VDD if the output signal of the sense amplifier 40 is high or its signal amplitude drops by approximately 100 mV toward VSS if the output signal of the sense amplifier 40 is low. OR signal wayhit01 of the hit signal of way0 and way1 brings the N-channel MOS transistors 44, 45 into conduction and the signal is provided to the sense amplifier 51. OR signal wayhit0123 of the hit signal of way0, way1, way2, or way3 causes the sense amplifier 51 for the data bus to operate and the amplitude of the signal becomes adequately large to drive the buffer 38 and the data is output through the buffer 38.

With the configuration described above, a low amplitude of the signal on the data bus 50 suffices, no tri-state buffer is required, and the signal propagates faster. In addition, because signals traveling on adjacent busses remains VDD or make transition toward VSS, the amplitudes of the signals do not change in opposite directions, therefore the capacity between the busses does not increase, reducing the delay time.

While the four-way set associative cache and the TLB are used in this embodiment, a physical arrangement in which one-way cache which is divided into four data memory modules may be used. In such an arrangement, each hit signal of the way represents a hit signal output from each of the data memory modules.

Figure 13:
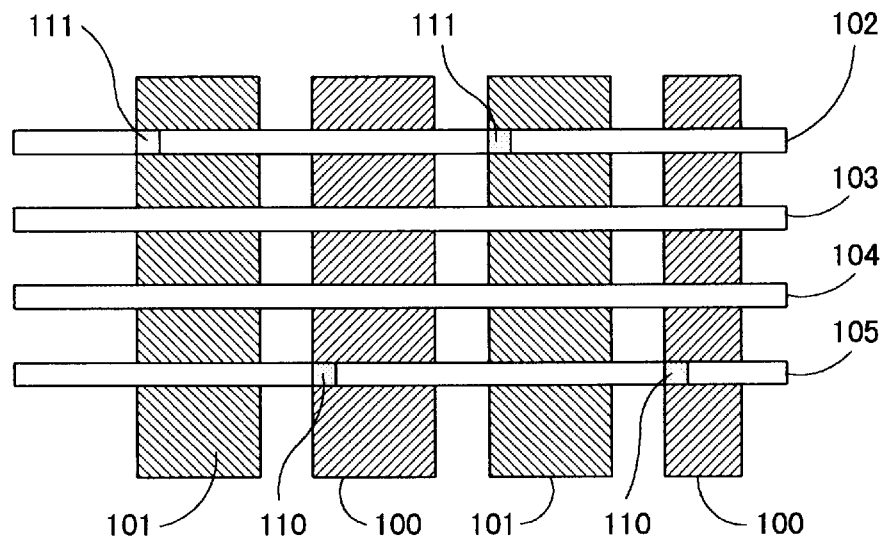
FIG. 13 shows a physical layout of a data buss in the semiconductor device of the fourth embodiment.

FIG. 13 shows the details of the data bus shown in FIG. 11. Because lines 103, 104 for data output from the cache memory are sandwiched between signal lines 102, 105 for opposite signal data output, noise from the other signals affecting the data output lines is reduced.

The signal lines 102, 105 are connected to a power supply line 100 and a grounding line 101 in the underlying layer through contacts 110, 111. In the underlying layer, the power supply line 100 and the grounding line 101 are provided alternately so as to intersect the data output lines 103, 104 at a right angle, thereby reducing the effect of noise from the underlying layer on the data output lines.

Figure 14:
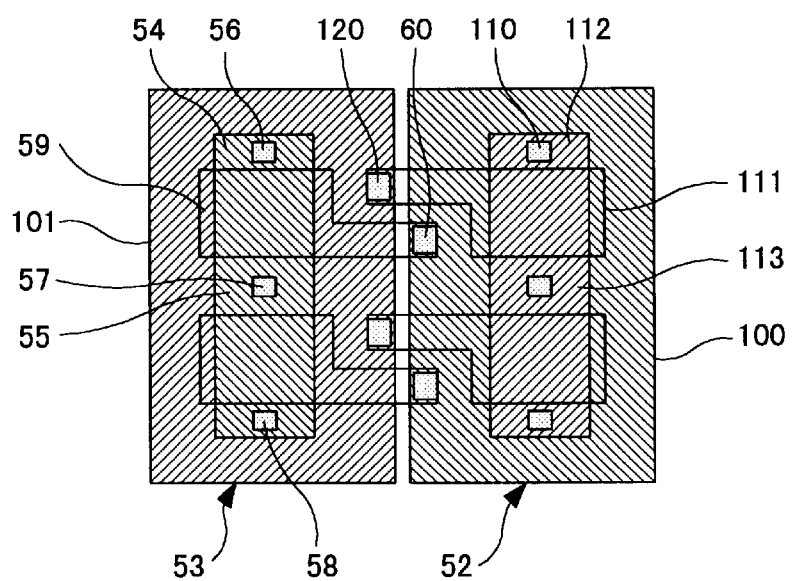
FIG. 14 shows a wiring diagram in the layer under the physical layout of the data bus in the semiconductor device of the fourth embodiment.

FIG. 14 shows the details of the underlying layer for explaining a method for reinforcing shielding. The drain 112 and the source 113 of a P-channel MOS transistor 52 are connected to a power supply line 100 through a contact 110. The gate 111 of the transistor 52 is connected to a grounding line 101 through a contact 120. The drain 54 and the source 55 of an N-channel MOS transistor 53 are connected to the grounding line 101 through contacts 56, 57, and 58 and the gate 59 is connected to the power supply line 100 through a contact 60. The stability of the potentials of the power supply line and the grounding line is reinforced by the gate capacity of the MOS transistors.

A mesh of power the supply lines and the grounding lines arranged as described above allows the effect of noise from the underlying lines on the data output lines to be minimized. By providing the power supply lines and the grounding lines alternately, voltage drops can be reduced.

ADVANTAGES OF THE INVENTION

As described above, in the semiconductor integrated circuit including a cache capability provided by a TLB and a cache according to the present invention, the cache comprises a cache TAG, cache data memory and the cache memory is divided into first and second cache data memory, which is disposed on both sides of the cache TAG, and the input/output circuit of the data TLB and the input/output circuit of the cache TAG are provided so as to be opposed to the input/output circuits of the first and second cache data memory across a bus area, thereby allowing wiring length to be reduced compared with a prior-art circuit to achieve a one chip LSI that provides faster processing speed.

While in the above-described embodiment the signal lines 102, 105 are connected to the power supply line 100 and the grounding line 101 in the underlying layer through the contacts 110, 111, the signal lines 102, 105 may be omitted or may not be connected to the power supply line 100 and the grounding line 101. Instead, the effect of noise from the underlying layer can be decreased by providing the power supply line 100 and the grounding line 101 in a layer below the data output lines 103, 104.

Furthermore, in a set associative cache having a plurality of ways, noise from the substrate or other signal lines which affects data busses can be minimized, and a voltage drop can be reduced by alternately providing power supply lines and grounding lines. In addition, data can be output from the cache at higher speed by outputting the data through a sense amplifier without using a buffer for the output.

What is claimed is:

1. A semiconductor integrated circuit including a cache capability provided by a Translation Look-aside Buffer (TLB) and a cache, wherein said cache comprises a cache memory index (TAG) memory module and a cache data memory module, said cache data memory module being divided into first and second cache data memory modules which are disposed on opposite sides of said TAG memory module; and input/output circuits of said TLB are opposed to an input/output circuit of said TAG memory module and input/output circuits of said first and second cache data memory modules across a bus area.

2. The semiconductor integrated circuit according to claim 1, wherein each of said TAG memory module and said first and second cache data memory modules is further divided into two and said divided modules are disposed on both sides of the TLB.

3. A semiconductor integrated circuit including a cache capability provided by a translation look-aside buffer (TLB) and a cache, wherein said TLB comprises a TLB TAG module storing address change data and a TLB data memory module storing Translation Look-aside data;

said cache comprises a TAG memory module storing cache memory index data and a cache data memory module storing cache data;

said TAG memory module is divided into a plurality of modules and said cache data memory module is divided into a plurality of modules;

said divided TAG memory modules are disposed on both sides of a longitudinal arrangement direction of the TLB TAG module and the TLB data memory module with the TLB TAG module and the TLB data memory module being sandwiched therebetween; and said divided cache data memory modules are grouped into two and disposed on both sides of said divided TAG memory modules.

4. The semiconductor integrated circuit according to claim 3, wherein the input/output circuits of one of the two groups of caches are opposed to the input/output circuits of the TLB, said input/output circuits being disposed on both sides of a longitudinal arrangement direction of the TLB TAG modules and the TLB data memory modules with the TLB TAG modules and the TLB data memory modules being sandwiched therebetween.

* * * * *